(12) United States Patent
Nakamura

(10) Patent No.: US 8,991,723 B2
(45) Date of Patent: Mar. 31, 2015

(54) MULTI-LAYER PIEZOELECTRIC ELEMENT, AND INJECTION DEVICE AND FUEL INJECTION SYSTEM INCORPORATING THE MULTI-LAYER PIEZOELECTRIC ELEMENT

(75) Inventor: Shigenobu Nakamura, Kirishima (JP)

(73) Assignee: Kyocera Corporation, Kyoto (JP)

( * ) Notice: Subject to any disclaimer, the term of this patent is extended or adjusted under 35 U.S.C. 154(b) by 641 days.

(21) Appl. No.: 13/322,122

(22) PCT Filed: May 26, 2010

(86) PCT No.: PCT/JP2010/058913
§ 371 (c)(1),
(2), (4) Date: Jan. 24, 2012

(87) PCT Pub. No.: WO2010/137618
PCT Pub. Date: Dec. 2, 2010

(65) Prior Publication Data
US 2012/0132729 A1 May 31, 2012

(30) Foreign Application Priority Data

May 26, 2009 (JP) .................................. 2009-125955
Aug. 25, 2009 (JP) .................................. 2009-193818

(51) Int. Cl.
*B05B 17/04* (2006.01)
*B05B 1/08* (2006.01)
(Continued)

(52) U.S. Cl.
CPC ....... *H01L 41/0472* (2013.01); *F02M 51/0603* (2013.01); *H01L 41/0477* (2013.01)
USPC ..................................................... 239/102.2

(58) Field of Classification Search
CPC ........... B05B 17/0607; B05B 17/0661; F02M 51/0603; F02M 51/0607; F02M 61/10; H01L 41/083; H01L 41/0838

USPC ................. 239/4, 102.1, 102.2, 533.2, 533.3; 310/328, 364–366
See application file for complete search history.

(56) References Cited

U.S. PATENT DOCUMENTS 6,252,337 B1 * 6/2001 Tanaka .......................... 310/364
6,511,763 B1 * 1/2003 Kida et al. .................... 428/699
(Continued)

FOREIGN PATENT DOCUMENTS

EP 1753039 A1 * 2/2007
EP 1763092 A1 3/2007
(Continued)

OTHER PUBLICATIONS

Extended European search report dated Dec. 12, 2013 issued in corresponding European application 10780573.1.
(Continued)

*Primary Examiner* — Len Tran
*Assistant Examiner* — Cody Lieuwen
(74) *Attorney, Agent, or Firm* — Volpe and Koenig, P.C.

(57) ABSTRACT

A multi-layer piezoelectric element includes a stacked body configured so that piezoelectric layers and internal electrode layers are alternately laminated, and an external electrode composed of a sintered material of both electrically conductive particles and a glass, the external electrode which is bonded to a side surface of the stacked body and makes electrical connection with the internal electrode layers. The external electrode has a stacked body-side layer region containing glass as secondary constituent at its stacked body-facing side, and an exterior-side layer region containing glass as minor constituent at its exterior side. The glass of the exterior-side layer region is distributed along grain boundary of the conductive particles on an outermost surface of the exterior-side layer region.

9 Claims, 8 Drawing Sheets

(51) Int. Cl.
*F02M 59/00* (2006.01)
*F02M 39/00* (2006.01)
*H01L 41/00* (2013.01)
*H02N 2/00* (2006.01)
*H01L 41/047* (2006.01)
*F02M 51/06* (2006.01)

(56) References Cited

U.S. PATENT DOCUMENTS

| | | | |
|---|---|---|---|
| 6,522,052 B2 | 2/2003 | Kihara et al. | |
| 7,276,841 B2 * | 10/2007 | Takaoka et al. | 310/363 |
| 2001/0047796 A1 | 12/2001 | Yamada et al. | 123/498 |
| 2008/0238264 A1 | 10/2008 | Nakamura et al. | 310/364 |
| 2009/0220765 A1 | 9/2009 | Okamura et al. | 428/316.6 |
| 2010/0282874 A1 | 11/2010 | Nakamura et al. | 239/585.1 |

FOREIGN PATENT DOCUMENTS

| | | |
|---|---|---|
| EP | 1998383 A1 | 12/2008 |
| JP | 2002-202024 | 7/2002 |
| JP | 2005-322691 | 11/2005 |
| WO | WO 2007/049697 A1 | 5/2007 |
| WO | WO 2007/097460 A1 | 8/2007 |
| WO | WO 2007097460 A1 * | 8/2007 |

OTHER PUBLICATIONS

Chinese language office action dated Jul. 24, 2013 and its English language Statement of Relevance of Non-English References Pursuant to 37 CFR 1.98(a)(3)(i) issued in corresponding Chinese application 201080023294.

* cited by examiner

MULTI-LAYER PIEZOELECTRIC ELEMENT, AND INJECTION DEVICE AND FUEL INJECTION SYSTEM INCORPORATING THE MULTI-LAYER PIEZOELECTRIC ELEMENT

CROSS-REFERENCE TO THE RELATED APPLICATIONS

This application is a national stage of international application No. PCT/JP2010/058913, filed on May 26, 2010, and claims the benefit of priority under 35 USC 119 to Japanese Patent Application No. 2009-125955, filed on May 26, 2009 and Japanese Patent Application No. 2009-193818, filed on Aug. 25, 2009, the entire contents of all of which are incorporated herein by reference.

TECHNICAL FIELD

The present invention relates to a multi-layer piezoelectric element for use as, for example, a piezoelectric driving element (piezoelectric actuator), a pressure sensor element, a piezoelectric circuit element, and the like.

BACKGROUND ART

By way of example, there is a conventional multi-layer piezoelectric element comprising: a stacked body configured so that piezoelectric layers and internal electrode layers are alternately laminated; and an external electrode composed of a sintered material of both electrically conductive particles and a glass, the external electrode which is bonded to a side surface of the stacked body and makes electrical connection with the internal electrode layers. The external electrode used therein is, as disclosed in Patent Literature 1, obtained by firing a coating of an electrically conductive paste containing electrically conductive particles such as silver particles and glass. That is, the external electrode can be formed by coating the electrically conductive paste onto the side surface of the stacked body and then performing firing thereon. Moreover, an external lead member for applying voltage to the external electrode is fixedly connected to the surface of the external electrode with use of solder, an electrically conductive adhesive, or the like.

CITATION LIST

Patent Literature

Patent Literature 1: Japanese Examined Patent Publication JP-B2 4158338

SUMMARY OF INVENTION

Technical Problem

However, in the multi-layer piezoelectric element as disclosed in Patent Literature 1, when it is used for a fuel injection device (injector) such as an automotive internal-combustion engine, expressed differently, when it is operated under a harsh condition of, for example, long-time continuous driving operation in the presence of high electric field and high pressure, part of the external electrode may peel off the side surface of the stacked body. This leads to an interruption of the supply of voltage to part of the piezoelectric layers, which gives rise to the problem of deterioration in displacement characteristics.

A potential cause behind the above problem is that a silver-containing electrically conductive paste having a silver-particle content of 97% by mass and a glass content of 3% by mass (silver-containing electrically conductive paste containing glass as a minor constituent) is used to form the external electrode on the side surface of the stacked body. That is, the amount of glass acting to achieve bonding of the external electrode and the stacked body is so small that the strength of bonding between them becomes insufficient. Another potential cause is that many glass components are present on the surface of the external electrode. In this case, when the external lead member is fixed to the surface of the external electrode by means of soldering, the external electrode exhibits poor solder wettability. As a result, much time is required to secure the external lead member by means of soldering, wherefore the stacked body is subjected to heat application for a long period of time. After all, a microcrack is developed on the bonding interface between the external electrode and the side surface of the stacked body, thus causing a significant decrease in the strength of bonding between the external electrode and the side surface of the stacked body.

The invention has been devised in view of the problem associated with the conventional art as mentioned above, and accordingly an object of the invention is to provide a multi-layer piezoelectric element in which strength of bonding between an external electrode and a stacked body can be enhanced, and the external electrode exhibits excellent solder wettability.

Solution to Problem

The invention provides a multi-layer piezoelectric element, comprising: a stacked body configured so that piezoelectric layers and internal electrode layers are alternately laminated; and an external electrode composed of a sintered material of both electrically conductive particles and a glass, the external electrode which is bonded to a side surface of the stacked body and makes electrical connection with the internal electrode layers, wherein the external electrode comprises a stacked body-side layer region which is located closer to the stacked body and contains glass as a secondary constituent, and an exterior-side layer region which is located closer to an exterior and contains glass as a minor constituent, and the glass of the exterior-side layer region is distributed along a grain boundary of the electrically conductive particles on an outermost surface of the exterior-side layer region.

Moreover, in the multi-layer piezoelectric element of the invention, it is preferable that a content of the glass in the stacked body-side layer region falls within a range of 5% to 20% by mass, and a content of the glass in the exterior-side layer region falls within a range of 0.01% to 5% by mass.

Moreover, in the multi-layer piezoelectric element of the invention, it is preferable that each of the glass in the stacked body-side layer region and the glass in the exterior-side layer region contains Pb.

Moreover, in the multi-layer piezoelectric element of the invention, it is preferable that the glass in the stacked body-side layer region further contains Si.

Moreover, in the multi-layer piezoelectric element of the invention, it is preferable that the stacked body-side layer region comprises a glass layer region which is rich in the glass thereof in a vicinity of an interface of the stacked body-side layer region and the stacked body.

Moreover, in the multi-layer piezoelectric element of the invention, it is preferable that the stacked body-side layer region and the exterior-side layer region contact with each other, and the glass is distributed along the grain boundary of the electrically conductive particles on an exposed portion of the exterior-side layer region including the outermost surface thereof.

Moreover, in the multi-layer piezoelectric element of the invention, it is preferable that the glass in an exposed portion of the stacked body-side layer region is distributed so as to cover the electrically conductive particles.

Moreover, in the multi-layer piezoelectric element of the invention, it is preferable that the glass is distributed along the grain boundary of the electrically conductive particles on a contact surface of the stacked body-side layer region abutted with the exterior-side layer region.

The invention provides an injection device, comprising: a container comprising an injection hole; and the multi-layer piezoelectric element mentioned above, wherein a fluid stored in the container is configured to be injected through the injection hole by driving the multi-layer piezoelectric element.

The invention provides a fuel injection system, comprising: a common rail configured to store high-pressure fuel; the injection device mentioned above, which is configured to inject the high-pressure fuel stored in the common rail; a pressure pump configured to supply the high-pressure fuel to the common rail; and an injection control unit configured to send a driving signal to the injection device.

Advantageous Effects of Invention

According to the invention, the multi-layer piezoelectric element comprises: the stacked body configured so that the piezoelectric layers and the internal electrode layers are alternately laminated; and the external electrode composed of a sintered material of both electrically conductive particles and a glass, the external electrode which is bonded to the side surface of the stacked body and makes electrical connection with the internal electrode layers. The external electrode comprises the stacked body-side layer region which is located closer to the stacked body and contains glass as a secondary constituent, and the exterior-side layer region which is located closer to an exterior and contains glass as a minor constituent. Accordingly, it is possible to enhance the strength of bonding between the external electrode and the side surface of the stacked body, as well as to provide excellent solder wettability on the surface of the external electrode.

That is, on the side of the external electrode toward the stacked body, a region containing glass as a secondary constituent that exhibits high bonding strength relative to the piezoelectric layers constituting the stacked body is formed as the stacked body-side layer region. This makes it possible to achieve a significant increase in the strength of bonding between the external electrode and the stacked body. On the other hand, the exterior-side layer region containing only trace glass components is formed closer to the exterior of the external electrode. This allows the external electrode whose surface exhibits excellent solder wettability to be formed. In this way, a significant reduction of the working time required for securing the external lead member to the surface of the external electrode via solder can be achieved. This makes it possible to suppress occurrence of a microcrack in the bonding interface of the external electrode and the side surface of the stacked body effectively due to the difference in thermal expansion between the external electrode and the stacked body as a result of soldering heating, and thereby suppress an undesirable decrease in the strength of bonding between the external electrode and the side surface of the stacked body.

Thus, even if the multi-layer piezoelectric element is used for a fuel injection device (injector), for example as an automotive internal-combustion engine, expressed differently, even if it is operated under a harsh condition of, for example, long-time continuous driving operation in the presence of high electric field and high pressure, it is possible to suppress peeling of part of the external electrode off the side surface of the stacked body. This makes it possible to suppress an interruption of the supply of voltage to part of the piezoelectric layers and ensuing decline in the displacement of the stacked body.

Moreover, in the multi-layer piezoelectric element of the invention, the glass of the exterior-side layer region is distributed along a grain boundary of the electrically conductive particles on an outermost surface of the exterior-side layer region. This makes it possible to restrain migration of the electrically conductive particles constituting the external electrode without impairing solder wettability. The following is a reason for this.

The migration of the electrically conductive particles constituting the external electrode is caused by ionization of the electrically conductive particles at grain boundary portions in an imperfectly-crystallized state. With this in view, glass is distributed to find its way into portions of the grain boundary susceptible to ionization. This allows bonding between the electrically conductive particles and the glass, with a consequent increase of ionization energy of the electrically conductive particles. As a result, the occurrence of migration caused by ionization of the electrically conductive particles can be restrained. It is noted that, by containing rich glass components in portions of the grain boundary, it is possible to avoid impairment of solder wettability.

In this way, even if the multi-layer piezoelectric element is driven to operate continuously for a long period of time in an atmosphere of high humidity, it is possible to restrain the migration of the electrically conductive particles constituting the external electrode that will eventually cause a spark between the external electrode and the internal electrode layer of opposite polarity at the side surface of the stacked body.

Further, since the glass of the exterior-side layer region is distributed along the grain boundary of the electrically conductive particles on the outermost surface of the exterior-side layer region, when a great tensile stress is exerted on the external electrode, portions of the glass distributed along the grain boundary would be the first to become cracked. This makes stress reduction possible. Therefore, even if the multi-layer piezoelectric element is driven to operate with greater displacement under application of a high electric field, since no crack appears in the electrically conductive particles of the external electrode, it is possible to protect the external electrode against an electrical break.

Moreover, in the multi-layer piezoelectric element of the invention, so long as the stacked body-side layer region has a glass content in a range of 5% to 20% by mass, the strength of bonding between the external electrode and the stacked body can be increased even further, and also the resistance of the external electrode can be kept at low level. This makes it possible to form the external electrode capable of satisfactory electrical connection with the internal electrode layer. That is, in the stacked body-side layer region of the external electrode, so long as the content of glass that exhibits high wettability to the piezoelectric layer and high bonding strength relative to the piezoelectric layer is greater than or equal to 5% by mass, the strength of bonding between the external electrode and the stacked body can be increased significantly. On the other hand, so long as the content of glass in the stacked body-side layer region of the external electrode is less than or equal to 20% by mass, it is possible to suppress unduly high resistance of the external electrode. Accordingly, when the multi-layer piezoelectric element is driven to operate at high speed under the passage of a large current, it is possible to suppress occurrence of local heat in the external electrode (especially, the part of connection between the external electrode and the internal electrode layer) that will eventually cause sparking.

Moreover, so long as the exterior-side layer region of the external electrode has a glass content in a range of 0.01% to 5% by mass, the electrically conductive particles constituting the external electrode can be restrained from migration without impairing solder wettability. That is, so long as the content of glass in the exterior-side layer region of the external electrode is greater than or equal to 0.01% by mass, the glass of the exterior-side layer region of the external electrode can be selectively distributed along the grain boundary of the electrically conductive particles on the outermost surface of the exterior-side layer region. This makes it possible to restrain the migration of the electrically conductive particles constituting the external electrode without impairing solder wettability. On the other hand, so long as the content of glass in the exterior-side layer region of the external electrode is less than or equal to 5% by mass, the surface of the external electrode can be made to exhibit satisfactory solder wettability.

Moreover, in the multi-layer piezoelectric element of the invention, where each of the glass in the stacked body-side layer region of the external electrode and the glass in the exterior-side layer region thereof contains Pb, it is possible to enhance the strength of bonding between the external electrode and the stacked body, as well as to render the surface of the external electrode highly migration-resistant. This is because the inclusion of Pb in the glass in the stacked body-side layer region helps increase the strength of bonding between the external electrode and the piezoelectric layer. Especially in the case of using PZT (lead zirconate titanate) containing Pb as the material of formation of the piezoelectric layer, particularly high bonding strength can be attained.

Meanwhile, the inclusion of Pb in the glass in the exterior-side layer region of the external electrode helps facilitate formation of a low-melting-point chemical compound of the electrically conductive particles and glass included in the external electrode. Therefore, by performing baking treatment at a temperature as low as 500 to 700° C. on an electrically conductive paste which is to be formed into the external electrode, it is possible to form a reaction phase of Pb and the electrically conductive particle at the grain boundary in a selective manner, and thereby restrain the migration of the electrically conductive particles. The inclusion of Pb is especially advantageous if the electrically conductive particles are composed predominantly of silver.

Moreover, where the electrically conductive particles are composed predominantly of silver, the inclusion of Pb is effective in suppressing sulfurization of the external electrode caused by a sulfur content in the air. That is, in the presence of Pb-containing glass at the grain boundary of the electrically conductive particles on the outermost surface of the exterior-side layer region, it is possible to suppress sulfurization of the external electrode and discoloration due to the sulfurization.

Moreover, the inclusion of Pb in the glass can contribute to a significant drop in glass softening point. This makes it possible to lower the temperature at which the electrically conductive paste to be formed into the external electrode is baked. As a result, it is possible to suppress occurrence of a residual stress at the interface between the stacked body and the external electrode due to a heat shock which takes place during the baking treatment, and peeling of the external electrode off the side surface of the stacked body in the course of driving operation.

Moreover, in the multi-layer piezoelectric element of the invention, where the glass in the stacked body-side layer region further contains Si, the strength of bonding between the glass contained in the stacked body-side layer region of the external electrode and the piezoelectric layer can be increased. This makes it possible to suppress peeling of the external electrode off the side surface of the stacked body due to long-time continuous driving operation.

Moreover, in the multi-layer piezoelectric element of the invention, in the case where the stacked body-side layer region comprises the glass layer region which is rich in the glass thereof in the vicinity of the interface of the stacked body-side layer region and the stacked body, the area of glass-bonded parts of the external electrode and the side surface of the stacked body can be increased by the provision of the glass layer region. This makes it possible to achieve a significant increase in the strength of bonding between the side surface of the stacked body and the external electrode.

Moreover, in the multi-layer piezoelectric element of the invention, the stacked body-side layer region and the exterior-side layer region contact with each other, and the glass is distributed along the grain boundary of the electrically conductive particles on an exposed portion of the exterior-side layer region including the outermost surface thereof. Accordingly, in the exterior-side layer region, a heat shock occurring at the time of attachment of a lead to the external electrode can be lessened for suppression of stress transmission to the stacked body-side layer region. This makes it possible to minimize the heat shock applied to the multi-layer piezoelectric element. Moreover, when a great tensile stress is exerted on the external electrode, portions of the glass distributed along the grain boundary of the exposed portion of the exterior-side layer region would be the first to become cracked, with a consequent stress reduction. This makes it possible to restrain stress transmission to the stacked body-side layer region. Thus, even if the multi-layer piezoelectric element is driven to operate with greater displacement under application of a high electric field, the driving operation can be effected with stability.

Moreover, in the multi-layer piezoelectric element of the invention, the glass in an exposed portion of the stacked body-side layer region is distributed so as to cover the electrically conductive particles. Therefore, a solder and a brazing material which are used for the lead attachment to the external electrode are formed only on the exterior-side layer region. Thus, even if a tensile force is exerted by a lead, it never occurs that a stress is concentrated at the boundary between the external electrode and the stacked body. In consequence, the stacked body becomes free from cracking, and stable driving operation can be achieved.

Moreover, in the multi-layer piezoelectric element of the invention, the glass is distributed along the grain boundary of the electrically conductive particles on a contact surface of the stacked body-side layer region abutted with the exterior-side layer region. This makes it possible to establish firm bonding of the electrically conductive particles constituting the stacked body-side layer region with the electrically conductive particles constituting the exterior-side layer region, as well as to achieve both electrical conduction and thermal conduction at the same time between the former electrically conductive particles and the latter electrically conductive particles. Accordingly, even if the multi-layer piezoelectric element is driven to operate with greater displacement under application of a high electric field, it is possible avoid that the external electrode undergoes local heat at its interior, wherefore the multi-layer piezoelectric element can be driven to operate with stability.

According to the invention, the injection device comprises: the container comprising an injection hole; and the multi-layer piezoelectric element of the invention, wherein a fluid stored in the container is configured to be injected through the injection hole by driving the multi-layer piezoelectric element. Since peeling of the external electrode off the side surface of the stacked body can be suppressed in the stacked piezoelectric element, it is possible to perform fluid injection in a desired manner with stability for a longer period of time.

According to the invention, the fuel injection system comprises: the common rail configured to store high-pressure fuel; the injection device of the invention which is configured to inject the high-pressure fuel stored in the common rail; the pressure pump configured to supply the high-pressure fuel to the common rail; and the injection control unit configured to send a driving signal to the injection device. With this construction, it is possible to effect desired injection of high-pressure fuel with stability for a long period of time.

DESCRIPTION OF EMBODIMENTS

Hereinafter, embodiments of a multi-layer piezoelectric element pursuant to the invention will be described in detail with reference to the drawings.

Figure 1:
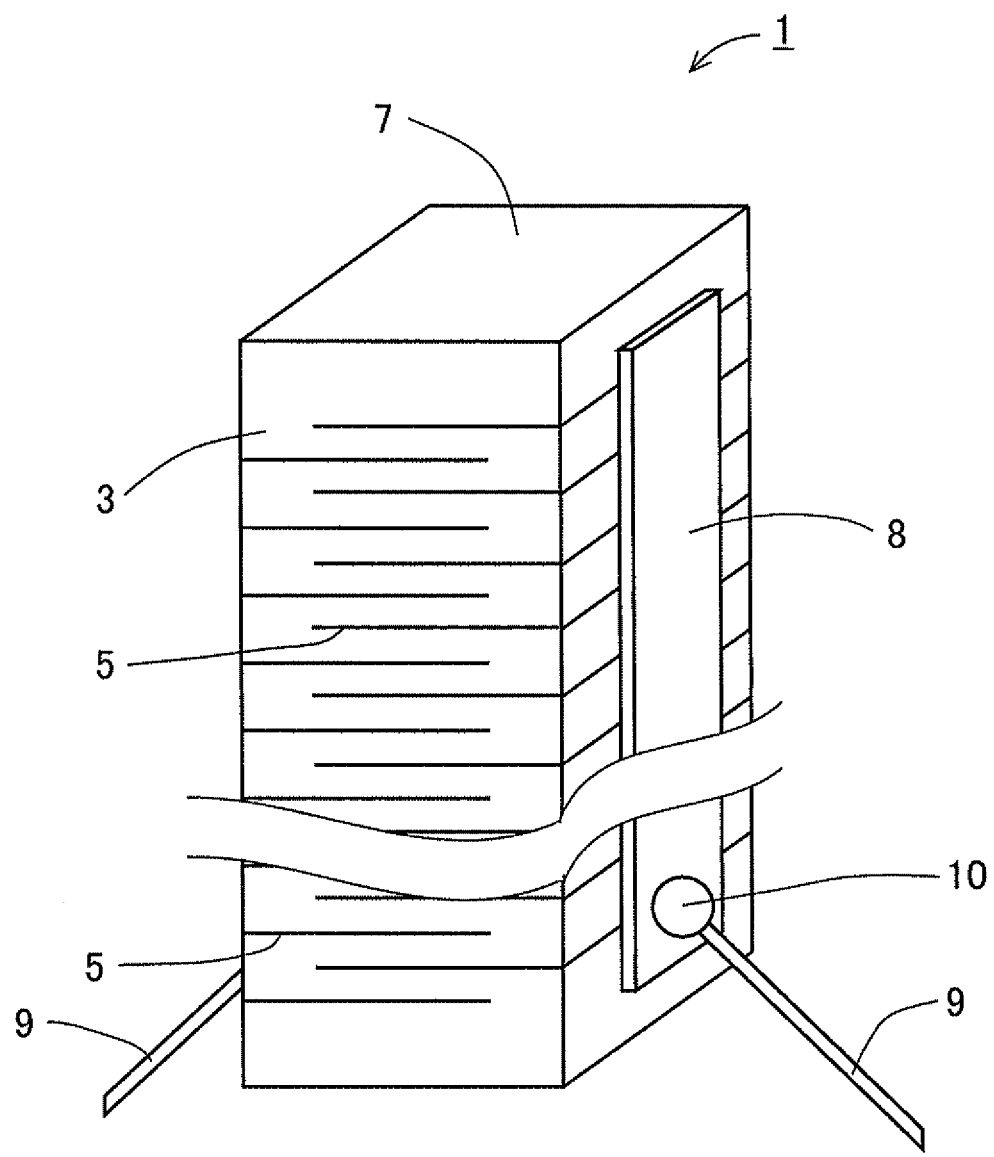
FIG. 1 is a perspective view showing an embodiment of a multi-layer piezoelectric element pursuant to the invention.
Figure 2:
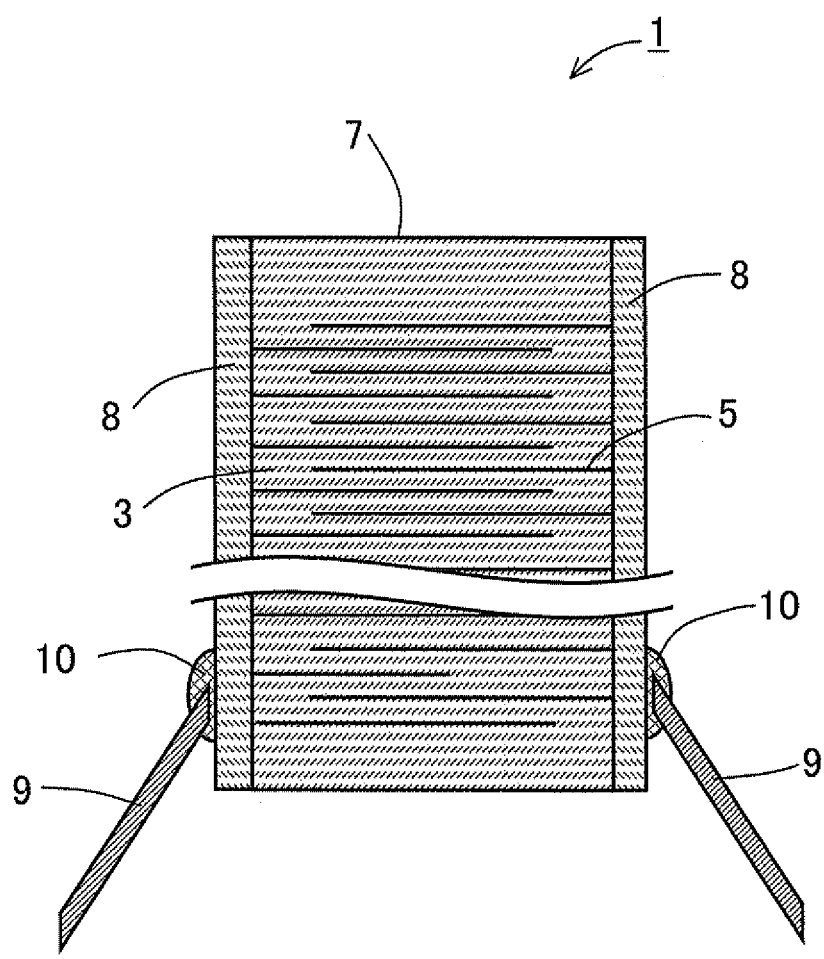
FIG. 2 is a sectional view of the multi-layer piezoelectric element shown in FIG. 1 taken on a section plane parallel to a stacked direction of the multi-layer piezoelectric element.
Figure 3:
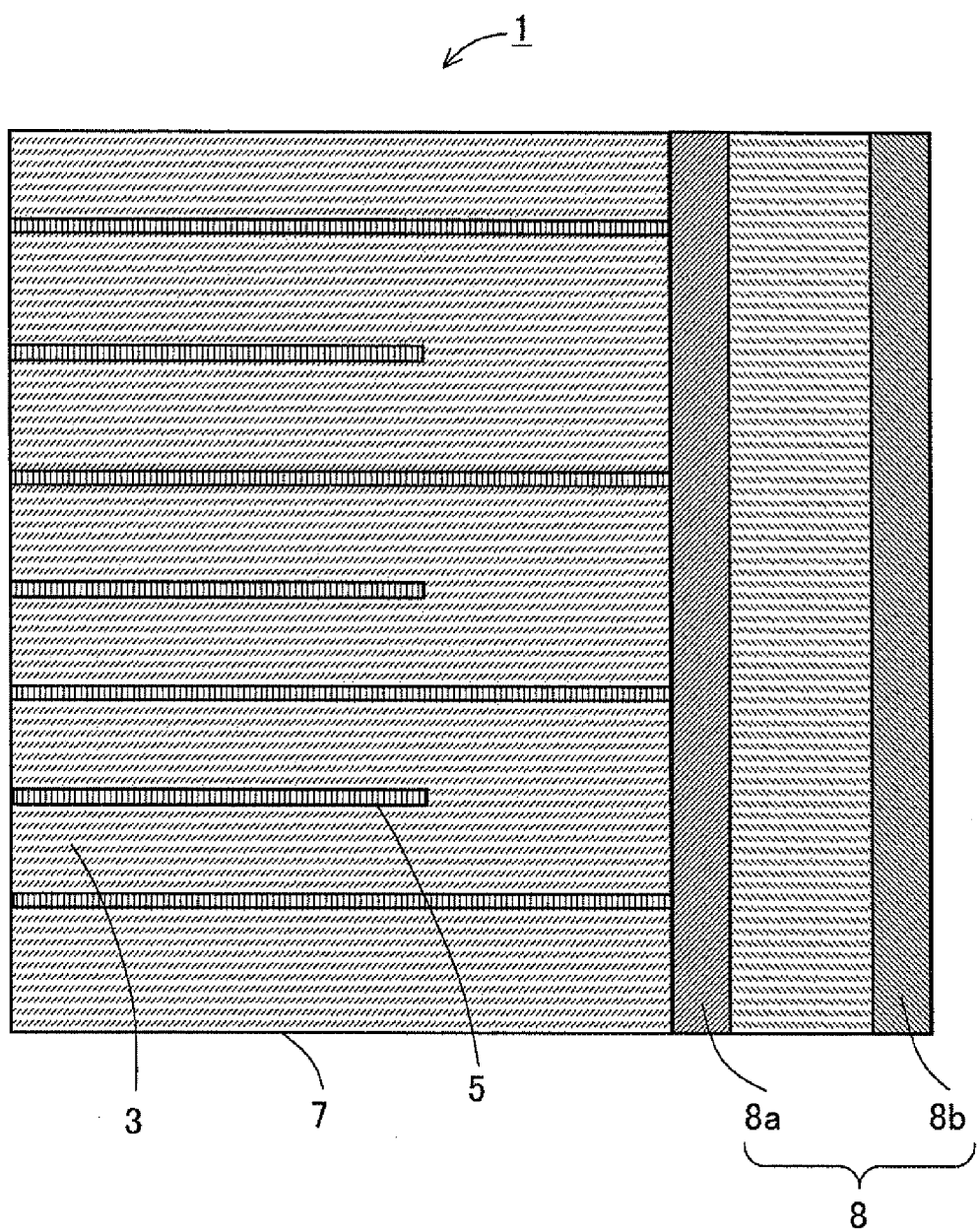
FIG. 3 is an enlarged sectional view of the multi-layer piezoelectric element shown in FIG. 1, illustrating a bonding interface between a stacked body and an external electrode and the vicinity thereof.

FIG. 1 is a perspective view showing an embodiment of a multi-layer piezoelectric element pursuant to the invention. FIG. 2 is a sectional view of the multi-layer piezoelectric element shown in FIG. 1 taken on a section plane parallel to a stacked direction of the multi-layer piezoelectric element. FIG. 3 is an enlarged sectional view of the multi-layer piezoelectric element shown in FIG. 1, illustrating a bonding interface between a stacked body and an external electrode and the vicinity thereof.

As shown in FIG. 3, the multi-layer piezoelectric element 1 of this embodiment comprises: a stacked body 7 configured so that piezoelectric layers 3 and internal electrode layers 5 are alternately laminated; and an external electrode 8 composed of a sintered material of both electrically conductive particles and a glass, the external electrode 8 which is bonded to a side surface of the stacked body 7 and makes electrical connection with the internal electrode layers 5. The external electrode 8 includes a stacked body-side layer region 8a which is located closer to the stacked body 7 and contains glass as a secondary constituent, and an exterior-side layer region 8b which is located closer to an exterior and contains glass as a minor constituent. Moreover, an external lead member 9 is connected to the surface of the external electrode 8 via solder 10.

In the above construction, the stacked body-side layer region 8a situated at that side of the external electrode which is bonded to the stacked body 7 contains glass as a secondary constituent that exhibits good wettability to the piezoelectric layer 3 and high bonding strength. Accordingly, the strength of bonding between the electrode 8 and the stacked body 7 can be maintained at a high level. On the other hand, the exterior-side layer region 8b contains glass which impairs solder wettability as a minor constituent. Accordingly, there arises no deterioration in solder wettability, wherefore the external lead member 9 can be connected to the external electrode 8 via the solder 10 with satisfactory wettability. This makes it possible to shorten the time required for soldering, and thereby suppress development of a crack at the bonding interface between the external electrode 8 and the stacked body 7 under a thermal stress resulting from heat liberated by soldering.

Hence, even if the multi-layer piezoelectric element 1 is driven to operate continuously at high speed, by virtue of the effects of the stacked body-side layer region 8a and the exterior-side layer region 8b, it is possible to suppress peeling of the external electrode 8 off the stacked body 7 that will eventually cause an interruption of the supply of voltage to part of the piezoelectric layers 3. In consequence, deterioration in displacement characteristics, as well as occurrence of a spark at the part of connection between the external electrode 8 and the internal electrode layer 5, can be suppressed.

It is preferable that the stacked body-side layer region 8a has a thickness in a range of 1 μm to 20 μm. So long as the thickness falls within the above range, there exists a sufficiency of glass that exhibits good wettability to the piezoelectric layer 3 and high bonding strength. This makes it possible to enhance the effect of keeping the strength of bonding between the external electrode 8 and the stacked body 7 at high level. Moreover, the stacked body-side layer region 8a containing glass as a secondary constituent is not made thicker than it needs to be. This makes it possible to reduce the proportion of highly-resistive part of the external electrode 8, and thereby suppress local heat of the stacked body-side layer region 8a under the passage of a large current through the multi-layer piezoelectric element 1 in a state of being driven to operate at high speed.

It is preferable that the exterior-side layer region 8b has a thickness in a range of 0.1 μm to 15 μm. So long as the thickness falls within the above range, the effect of connecting the external lead member 9 to the external electrode 8 via the solder 10 with satisfactory wettability can be enhanced, and electrically conductive particles 11 can be restrained from migration effectively.

As a way to form the stacked body-side layer region 8a and the exterior-side layer region 8b in the external electrode 8, there is a technique of subjecting two electrically conductive pastes having different glass contents to printing and baking treatment, respectively.

Figure 4A:
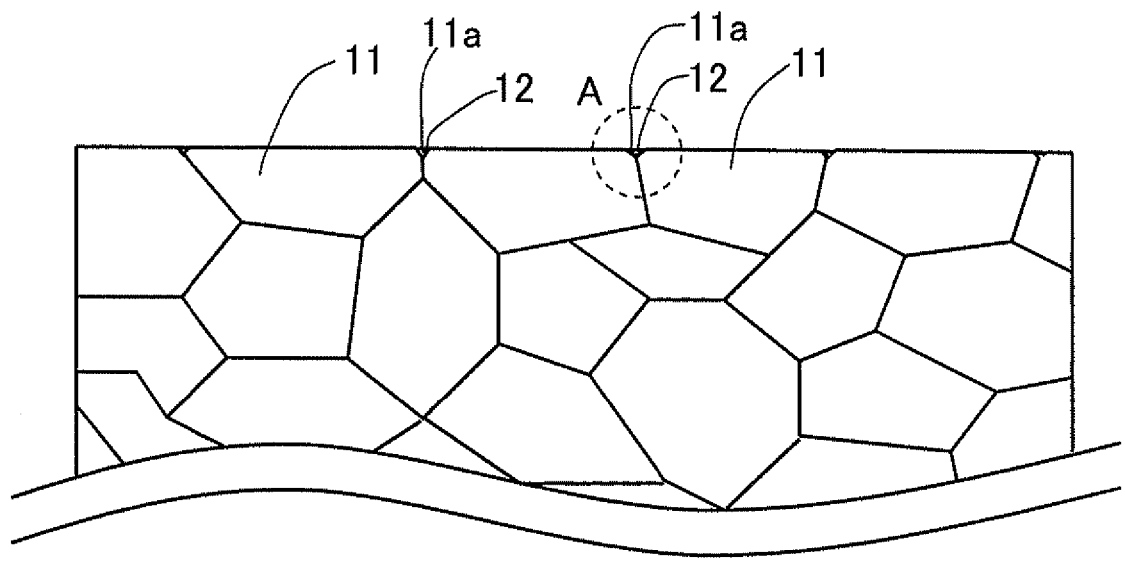
FIG. 4(a) is an enlarged sectional view of the external electrode of the multi-layer piezoelectric element shown in FIG. 1, illustrating the outermost surface of its exterior-side layer region and the vicinity thereof.
Figure 4B:
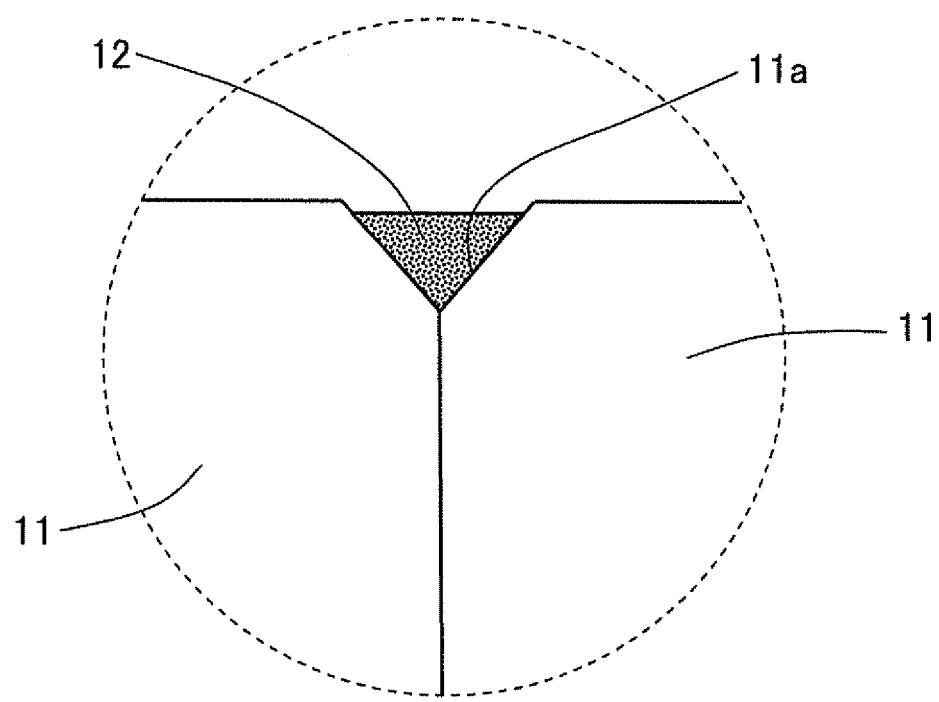
FIG. 4(b) is an enlarged sectional view of a portion A of grain boundary depicted in FIG. 4(a)
Figure 5:
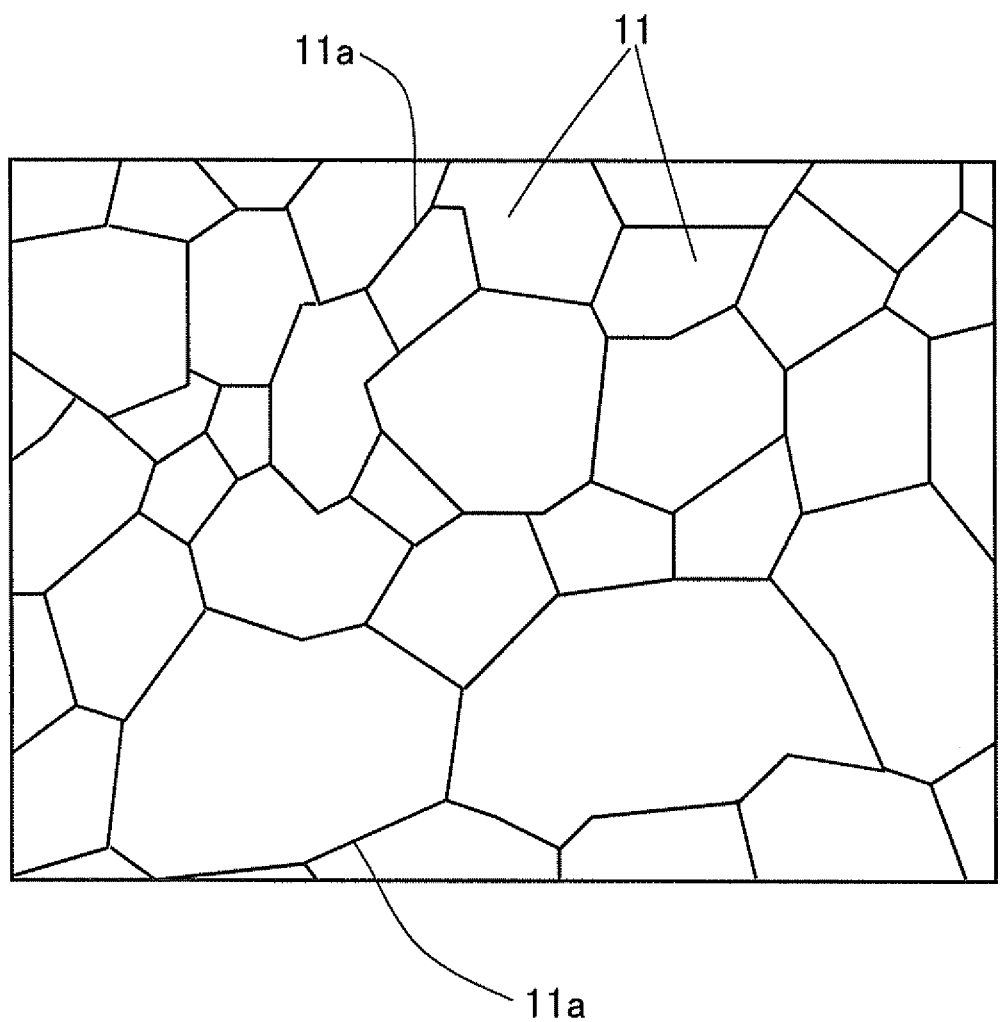
FIG. 5 is an enlarged plan view of the external electrode of the multi-layer piezoelectric element shown in FIG. 1, illustrating the outermost surface of its exterior-side layer region.

Moreover, as shown in FIGS. 4 and 5, the glass 12 of the exterior-side layer region 8b is distributed along a grain boundary 11a of the electrically conductive particles 11 on an outermost surface of the exterior-side layer region 8b. This makes it possible to restrain migration of the electrically conductive particles 11 constituting the external electrode 8 without impairing solder 10 wettability. That is, in the case of distributing the glass 12 among portions of the grain boundary 11a, which are part of the electrically conductive particles 11 in an imperfectly-crystallized state, bonding is developed between the electrically conductive particles 11 and the glass 12, with a consequent increase in the ionization energy of the electrically conductive particles 11. As a result, the electrically conductive particles 11 can be restrained from ionization at portions of the grain boundary 11a. Therefore, even if the multi-layer piezoelectric element 1 is driven to operate in an atmosphere of high humidity, it is possible to suppress occurrence of migration in the external electrode 8 that will eventually cause a spark between the external electrode 8 and the internal electrode layer 5 of opposite polarity at the side surface of the stacked body 7.

Further, since the glass 12 of the exterior-side layer region 8b is distributed along the grain boundary 11a of the electrically conductive particles 11 on the outermost surface of the exterior-side layer region 8b, when a great tensile stress is exerted on the external electrode 8, portions of the glass 12 distributed along the grain boundary 11a would be the first to become cracked. This makes stress reduction possible. Therefore, even if the multi-layer piezoelectric element 1 is driven to operate with greater displacement under application of a high electric field, since no crack appears in the electrically conductive particles 11 of the external electrode 8, it is possible to protect the external electrode 8 against an electrical break.

As used herein, the expression "the glass 12 is distributed along the grain boundary 11a of the electrically conductive particles 11" refers to the condition that the glass 12 is distributed on the outermost surface of the exterior-side layer region 8b so as not to cover the electrically conductive particles 11.

It is preferable that a ratio in area of the glass 12 to the outermost surface of the exterior-side layer region 8b falls within a range of 0.1% to 10%. So long as the ratio falls within the above range, the electrically conductive particles 11 constituting the external electrode 8 can be restrained from migration without impairing solder 10 wettability.

In this construction, a metal such as silver, gold, nickel, copper, and palladium, or an alloy of such metals can be used as the material of formation of the electrically conductive particles 11 constituting the external electrode 8. Because of its low resistivity, anti-oxidation property, and relatively low cost, silver is desirable for use.

It is preferable that the electrically conductive particles 11 have an average particle size in a range of 0.5 µm to 5 µm. So long as the average particle size falls within the above range, the external electrode 8 can be densified into a condition of low resistance, and also portions of the grain boundary 11a in the surface of the exterior-side layer region 8b can be kept at proper level in terms of abundance. Therefore, the glass 12 existing at the grain boundary 11a contributes to stress reduction, and more specifically, when a great tensile stress is exerted on the external electrode 8, portions of the glass 12 distributed along the grain boundary 11a would be the first to become cracked. This makes stress reduction possible. If the average particle size of the electrically conductive particles 11 is greater than 5 µm, the electrically conductive particles 11 will have so large a particle size that the abundance of portions of the grain boundary 11a is decreased. In consequence, when a great tensile stress is exerted on the external electrode 8, a crack is likely to appear inside the electrically conductive particles 11 that will eventually cause a spark in the external electrode 8.

Moreover, it is preferable that the stacked body-side layer region 8a has a glass content as a secondary constituent in a range of 5% to 20% by mass. So long as the amount of glass contained as a secondary constituent in the stacked body-side layer region 8a is greater than or equal to 5% by mass, a sufficiency of glass that exhibits good wettability to the piezoelectric layer 3 and high bonding strength exists in the stacked body-side layer region 8a. Accordingly, the strength of bonding between the external electrode 8 and the stacked body 7 can be maintained at a high level. On the other hand, so long as the amount of glass contained as a secondary constituent in the stacked body-side layer region 8a is less than or equal to 20% by mass, the resistance of the external electrode 8 can be maintained at a low level. Accordingly, even if the multi-layer piezoelectric element 1 is driven to operate at high speed under the passage of a large current, it is possible to suppress occurrence of local heat in the external electrode 8 (especially, the part of connection between the external electrode 8 and the internal electrode layer 5) that will eventually cause sparking at the part of connection between the external electrode 8 and the internal electrode layer 5.

Moreover, it is preferable that the exterior-side layer region 8b has a glass content as a minor constituent in a range of 0.01% to 5% by mass. So long as the amount of glass contained as a minor constituent in the exterior-side layer region 8b is greater than or equal to 0.01% by mass, at the outermost surface of the exterior-side layer region 8b, the glass 12 can be distributed in a selective manner so as to run along the grain boundary 11a of the electrically conductive particles 11. Accordingly, the electrically conductive particles 11 constituting the external electrode 8 can be restrained from migration effectively. On the other hand, so long as the amount of glass contained as a minor constituent in the exterior-side layer region 8b is less than or equal to 5% by mass, the amount of the glass 12 distributed on the outermost surface of the exterior-side layer region 8b can be reduced. It will thus never occur that the solder 10 wettability is impaired.

Moreover, it is preferable that an amount of glass contained in that part of the external electrode 8 which lies between the stacked body-side layer region 8a and the exterior-side layer region 8b falls in between the glass content of the stacked body-side layer region 8a and the glass content of the exterior-side layer region 8b. In this construction, the external electrode 8 can be so configured that its glass content changes gradually from the stacked body-facing side to the exterior side. Therefore, there is an effect that a stress exerted on the external electrode 8 by the extension and contraction of the stacked body 7 can be dispersed.

The amount of glass contained as a secondary constituent in the stacked body-side layer region 8a and the amount of glass contained as a minor constituent in the exterior-side layer region 8b can be controlled for example by making adjustment to the amounts of glass contained in the electrically conductive pastes constituting these regions, respectively.

Moreover, the glass contained as a secondary constituent in the stacked body-side layer region 8a and the glass contained as a minor constituent in the exterior-side layer region 8b are each of a glass material containing an element such as silicon, boron, lead, potassium, sodium, barium, zinc, phosphorus, aluminum, magnesium, or bismuth.

Further, it is preferable that, in the external electrode 8, each of the glass in the stacked body-side layer region 8a and the glass in the exterior-side layer region 8b contains Pb.

In the case where the glass in the stacked body-side layer region 8a contains Pb, since Pb is capable of providing high bonding strength relative to the piezoelectric layer 3 constituting the stacked body 7, it is possible to increase the strength of bonding between the external electrode 8 and the stacked body 7. Especially in the case where lead zirconate titanate (PZT) containing Pb is used as the material of formation of the piezoelectric layer 3, since the piezoelectric layer 3 is made to contain Pb as one of major constituents, and the glass in the stacked body-side layer region 8a also contains Pb, it is possible to attain particularly high bonding strength. Moreover, since the glass in the stacked body-side layer region 8a contains Pb which is one of the major constituents of the piezoelectric layer 3, it is possible to suppress deterioration in the piezoelectric characteristics of the piezoelectric layer 3.

It is preferable that the glass in the stacked body-side layer region 8a of the external electrode 8 has a Pb content in a range of 30% to 70% by mass in oxide terms. So long as the Pb content falls within the above range, the strength of bonding between the external electrode 8 and the stacked body 7 can be enhanced even further, and also the advantage is obtained that the glass in itself is free from a reduction in strength.

The Pb content of the glass in the stacked body-side layer region 8a of the external electrode 8 can be controlled by adjusting the content of each constituent component at the time of glass composition adjustment.

Moreover, it is preferable that the glass in the exterior-side layer region 8b contains Pb. In this case, the electrically conductive particles constituting the external electrode 8 and the glass tend to form a chemical compound having a low melting point. Therefore, by performing baking treatment at a temperature as low as 500 to 700° C. on the electrically conductive paste which is to be formed into the external electrode 8, it is possible to form a reaction phase of Pb and the electrically conductive particle 11 at the grain boundary in a selective manner, and thereby restrain migration of the electrically conductive particles 11 effectively. Especially in the case where the electrically conductive particles 11 constituting the external electrode 8 are composed predominantly of silver, the inclusion of Pb is effective at restraining migration of the electrically conductive particles 11, because Pb and silver tend to form a chemical compound having a low melting point. Moreover, where the electrically conductive particles 11 constituting the external electrode 8 are composed predominantly of silver, by the formation of a reaction phase of the electrically conductive particle 11 and the glass at portions of the grain boundary, sulfurization of silver caused by a sulfur content in the air can be suppressed effectively. Further, the inclusion of Pb in the glass can contribute to a significant drop in glass softening point. This makes it possible to lower the temperature at which the electrically conductive paste to be formed into the external electrode 8 is baked, and thereby suppress occurrence of a residual stress at the bonding interface between the stacked body 7 and the external electrode 8 due to a heat shock which takes place during the baking treatment for the electrically conductive paste of the external electrode 8, and peeling of the external electrode 8 off the stacked body 7 in the course of driving operation of the multi-layer piezoelectric element 1.

It is preferable that the glass in the exterior-side layer region 8b of the external electrode 8 has a Pb content in a range of 70% to 98% by mass in oxide terms. So long as the Pb content falls within the above range, the electrically conductive particles 11 can be restrained from migration more effectively, and also the baking temperature can be lowered. This makes it possible to suppress occurrence of a crack at the interface between the external electrode 8 and the stacked body 7 due to a heat shock.

The Pb content of the glass in the exterior-side layer region 8b of the external electrode 8 can be controlled by adjusting the content of each constituent component at the time of glass composition adjustment.

Moreover, it is preferable that the glass in the stacked body-side layer region 8a contains Si. In this case, the strength of bonding between the glass and the piezoelectric layer 3 can be increased. Therefore, even if the multi-layer piezoelectric element 1 is driven to operate for a long period of time, it is possible to suppress peeling of the external electrode 8 off the side surface of the stacked body 7.

It is preferable that the glass in the stacked body-side layer region 8a of the external electrode 8 has a Si content in a range of 30% to 70% by mass in oxide terms. So long as the Si content falls within the above range, the strength of bonding between the glass and the piezoelectric layer 3 can be enhanced even further. In addition, since the baking temperature is not so high, it is possible to suppress fluctuations in piezoelectric characteristics that take place depending upon the baking temperature, as well as to suppress occurrence of a crack at the interface between the external electrode 8 and the stacked body 7 due to a heat shock.

The Si content of the glass in the stacked body-side layer region 8a of the external electrode 8 can be controlled by adjusting the content of each constituent component at the time of glass composition adjustment.

Moreover, it is preferable that the stacked body-side layer region 8a comprises a glass layer region which is rich in the glass thereof in the vicinity of the bonding interface of the stacked body-side layer region 8a and the stacked body 7. In this case, since the glass layer region exhibits high bonding strength relative to the piezoelectric layer 3, it is possible to increase the strength of bonding between the external electrode 8 and the stacked body 7. Besides, the formation of the glass layer region makes it possible to increase the area of bonding between the glass and the piezoelectric layer 3, and thereby achieve a significant increase in the strength of bonding between the external electrode 8 and the stacked body 7.

It is preferable that the glass layer region has a thickness in a range of 0.1 μm to 3 μm. So long as the thickness falls within the above range, it is possible to enhance the effect of keeping the strength of bonding between the external electrode 8 and the stacked body 7 at high level, as well as to maintain satisfactory bonding between the internal electrode layer 5 and the external electrode 7.

For example, the glass layer region can be formed by a method comprising adding glass exhibiting good wettability to the piezoelectric layer 3 to the electrically conductive paste for forming the stacked body-side layer region 8a and performing baking treatment at a temperature which is higher than or equal to the softening point of the glass.

Figure 6:
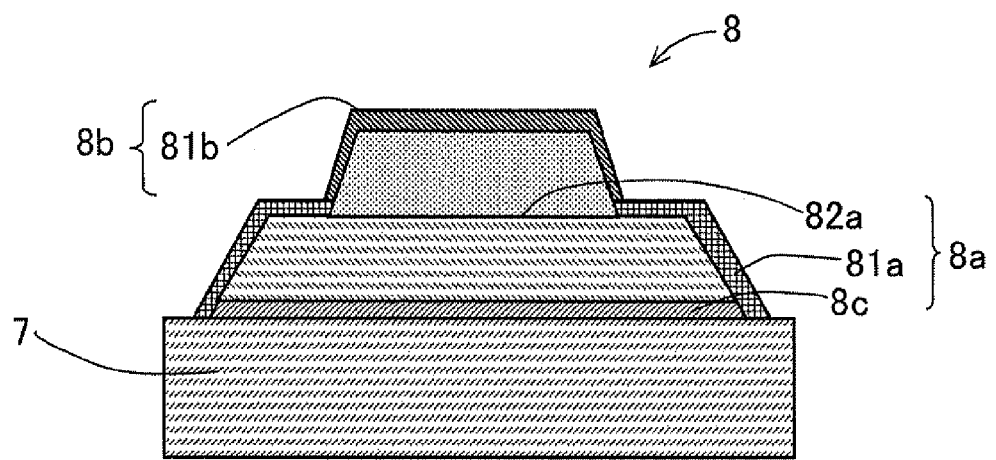
FIG. 6 is a sectional view of the multi-layer piezoelectric element showing another embodiment pursuant to the invention taken on a section plane vertical to the stacked direction of the multi-layer piezoelectric element.

It is noted that the invention is not limited in form to the embodiment as shown in FIG. 3, but may be implemented as a construction as shown in FIG. 6 in which the stacked body-side layer region 8a and the exterior-side layer region 8b contact with each other, and, as shown in FIG. 4, the glass is distributed along the grain boundary 11a of the electrically conductive particles 11 on an exposed portion 81b of the exterior-side layer region 8b including the outermost surface thereof. In this construction, in the exterior-side layer region 8b, a heat shock occurring at the time of attachment of a lead to the external electrode 8 can be lessened for suppression of stress transmission to the stacked body-side layer region 8a. This makes it possible to minimize the heat shock applied to the multi-layer piezoelectric element 1. Moreover, when a great tensile stress is exerted on the external electrode 8, portions of the glass 12 distributed along the grain boundary of the exposed portion 81*b* of the exterior-side layer region 8*b* would be the first to become cracked. This makes it possible to achieve stress reduction, and thereby restrain stress transmission to the stacked body-side layer region 8*a*. Thus, even if the multi-layer piezoelectric element 1 is driven to operate with greater displacement under application of a high electric field, the driving operation can be effected with stability.

It is preferable that the glass 12 in an exposed portion 81*a* of the stacked body-side layer region 8*a* is distributed so as to so as to cover the electrically conductive particles. Where the glass 12 in the exposed portion 81*a* of the stacked body-side layer region 8*a* is distributed so as to cover the electrically conductive particles, solder and a brazing material used for the lead attachment to the external electrode 8 are formed only on the exterior-side layer region 8*b*. Thus, even if a tensile force is exerted on the external electrode by a lead, it never occurs that a stress is concentrated at the boundary between the external electrode 8 and the stacked body 7. In consequence, the stacked body 7 becomes free from cracking, and stable driving operation can be achieved.

Moreover, it is preferable that the glass 12 is distributed along the grain boundary 11*a* of the electrically conductive particles 11 on a contact surface 82*a* of the stacked body-side layer region 8*a* abutted with the exterior-side layer region 8*b*. Where the glass 12 is distributed along the grain boundary 11*a* of the electrically conductive particles 11 on the contact surface 82*a* of the stacked body-side layer region 8*a* abutted with the exterior-side layer region 8*b*, it is possible to allow firm bonding of the electrically conductive particles 11 constituting the stacked body-side layer region 8*a* with the electrically conductive particles 11 constituting the exterior-side layer region 8*b*, as well as to achieve both electrical conduction and thermal conduction at the same time between the former electrically conductive particles 11 and the latter electrically conductive particles 11. Therefore, even if the multi-layer piezoelectric element 1 is driven to operate with greater displacement under application of a high electric field, it never occurs that the external electrode 8 undergoes local heat at its interior. This makes it possible to achieve stable driving operation of the multi-layer piezoelectric element 1.

Also in the external electrode 8 as shown in FIG. 6 in which the stacked body-side layer region 8*a* and the exterior-side layer region 8*b* contact with each other, the stacked body-side layer region 8*a* may comprise a glass layer region 8*c* which is rich in the glass thereof in the vicinity of the bonding interface of the stacked body-side layer region 8*a* and the stacked body 7. Moreover, as shown in FIG. 6, the external electrode 8 may be so configured that the exterior-side layer region 8*b* is made smaller in width than the stacked body-side layer region 8*a*.

Next, a method for manufacturing the multi-layer piezoelectric element 1 of the present embodiment will be described.

To begin with, ceramic green sheets which turn to the piezoelectric layers 3 are formed. To be specific, calcined powder of piezoelectric ceramics, a binder made of an organic high polymer such as acrylic polymer or butyral polymer, and a plasticizer are mixed to prepare a ceramic slurry. The ceramic slurry is shaped into ceramic green sheets by a tape molding technique such as the doctor blade method or the calendar roll method. The piezoelectric ceramics may be of any given type so long as it has piezoelectric properties. For example, a perovskite-type oxide made of lead zirconate titanate (PZT: $PbZrO_3$—$PbTiO_3$) can be used. Moreover, as the plasticizer, dibutyl phthalate (DBP), dioctyl phthalate (DOP), or the like can be used.

Next, an electrically conductive paste which turns to the internal electrode layer 5 is formed. To be specific, the electrically conductive paste is prepared by admixing a binder and a plasticizer in metal powder of a silver-palladium alloy. The electrically conductive paste is applied onto the aforestated ceramic green sheet in a specific pattern of the internal electrode layer 5 by means of screen printing. Then, a plurality of ceramic green sheets with the electrically conductive paste printed thereon are laminated on top of each other. The resultant is subjected to debinding, or binder removal treatment at a predetermined temperature, and is whereafter fired at a temperature of 900 to 1200° C. In this way, there is obtained a stacked body 7 composed of a stack of alternate piezoelectric layers 3 and internal electrode layers 5.

It is noted that the stacked body 7 can be formed not only by the above manufacturing technique, but by any given technique capable of formation of the stacked body 7 composed of a laminate of alternate piezoelectric layers 3 and internal electrode layers 5.

Next, the stacked body 7 thereby obtained through the firing process is ground into a predetermined shape by means of a surface grinder or otherwise.

After that, a silver/glass-containing electrically conductive paste (electrically conductive paste A), which is prepared by adding a binder, a plasticizer, and a solvent to a mixture of electrically conductive particles 11 composed predominantly of silver, Pb and Si, and a predetermined content (preferably 5 to 20% by mass) of glass as a secondary constituent, is printed onto a side surface of the stacked body 7 in a specific pattern of the external electrode 8 by means of screen printing or otherwise. After the electrically conductive paste A is dried, baking treatment is performed thereon at a temperature of 650 to 750° C. In this way, a stacked body-side layer region 8*a* of the external electrode 8 can be formed. At this time, it is advisable to use, as the glass contained in the electrically conductive paste A, glass which contains Pb and Si for good wettability to the piezoelectric layer 3 and has a softening point which is lower than or equal to the temperature for baking treatment. Accordingly, the stacked body-side layer region 8*a* can have a glass layer region which is rich in the glass thereof in the vicinity of the interface of the stacked body-side layer region 8*a* and the stacked body 7.

After that, a silver/glass-containing electrically conductive paste (electrically conductive paste B), which is prepared by adding a binder, a plasticizer, and a solvent to a mixture of electrically conductive particles 11 composed predominantly of silver, Pb, and a predetermined content (preferably 0.01 to 5% by mass) of glass as a minor constituent, is printed onto the surface of the stacked body-side layer region 8*a* by means of screen printing or otherwise. After the electrically conductive paste B is dried, baking treatment is performed at a temperature of 550 to 650° C. In this way, an exterior-side layer region 8*b* can be formed on the stacked body-side layer region 8*a*. At this time, it is advisable to use, as the glass contained in the electrically conductive paste B, glass containing Pb which tends to form a low-melting-point chemical compound in conjunction with the silver electrically conductive particles 11, the softening point of which as observed when mixed with the silver electrically conductive particles 11 is lower than or equal to the baking temperature. This makes it possible to perform baking treatment at a relatively low temperature of 550 to 650° C., and thus allow the Pb-containing glass to be distributed along the grain boundary of the electrically conductive particles 11.

Moreover, according to the way of forming the external electrode 8 thus far described, two different electrically conductive pastes A and B are used. It is however possible to use additionally a silver-glass electrically conductive paste (electrically conductive paste C) which differs in composition from the pastes A and B. In this case, the electrically conductive paste C is print-coated between a layer of the electrically conductive paste A and a layer of the electrically conductive paste B, followed by baking treatment. As a result, between the stacked body-side layer region 8a and the exterior-side layer region 8b is formed an intermediate layer having a composition different from those of the regions 8a and 8b.

Further, according to the way of forming the external electrode 8 thus far described, the baking treatment for the electrically conductive paste A and the baking treatment for the electrically conductive paste B are performed separately. Where the pastes are adjusted to a thickness range that the stacked body-side layer region 8a and the exterior-side layer region 8b can be formed at the same time, such a treatment may be performed that the electrically conductive paste A is printed and dried to form a layer, and then the electrically conductive paste B is printed on the surface of the layer and dried to form another layer, and after that, the two layers are subjected to baking treatment simultaneously.

Moreover, in order to obtain the construction as shown in FIG. 6, it is advisable to exploit the effect of reduction in the rate of diffusion of glass on the surface of the external electrode 8, which is accomplished by adjusting the partial pressure of oxygen at which the electrically conductive paste B is printed and baked to be higher than that at which the electrically conductive paste A is printed and baked. In this way, although the glass 12 in the surface of the stacked body-side layer region 8a (the exposed portion 81a and the contact surface abutted with the exterior-side layer region 8b) is distributed so as to cover the electrically conductive particles 11 immediately after the baking of the electrically conductive paste A, following the completion of printing of the electrically conductive paste B to the upper surface of the electrically conductive paste A and subsequent baking treatment, the glass 12 at the interface between the electrically conductive paste A and the electrically conductive paste B (the contact surface 82a of the stacked body-side layer region 8a abutted with the exterior-side layer region 8b) spreads over the surface of the electrically conductive paste B. As a result, there is formed the exterior-side layer region 8b having the exposed portion 81b over which the glass 12 is distributed along the grain boundary 11a of the electrically conductive particles 11.

The control of oxygen partial pressure can be exercised by a technique of changing the flow rate of oxygen in an atmosphere gas during baking treatment, a technique of changing the amount of carbon which consumes oxygen in an atmosphere gas during baking treatment, or otherwise. For example, by increasing the amount of resin components contained in the electrically conductive paste, carbon becomes larger in quantity, with a consequent increase in the quantity of oxygen to be consumed. This leads to a reduction in oxygen partial pressure.

It is noted that the way of exercising control of oxygen partial pressure is not limited to the above techniques, but may be of another typical method as appropriate.

Next, the external lead member 9 is fixedly connected to the surface of the external electrode 8 via the solder 10. After that, the stacked body 7 connected with the external lead member 9 is immersed in a resin solution containing silicone resin which is formed into exterior resin (not shown). Then, the resin solution is subjected to vacuum degassing treatment to cause the silicone resin to adhere tightly to an outer peripheral surface of the stacked body 7. Subsequently, the stacked body 7 is pulled out of the resin solution, whereupon a silicone resin layer is coated on the side surface of the stacked body 7 in which the external lead member 9 is fixedly connected to the surface of the external electrode 8.

After that, a direct current electric field of 0.1 to 3 kV/mm is applied to the external lead member 9 connected to each of the paired external electrodes 8 to initiate polarization in the piezoelectric layer 3 constituting the stacked body 7. In this way, the construction of the multi-layer piezoelectric element 1 is completed. In this multi-layer piezoelectric element 1, the external electrode 8 and an external power source are connected to each other via the external lead member 9, so that a voltage can be applied to the piezoelectric layer 3. This allows each of the piezoelectric layers 3 to undergo significant displacement under an inverse piezoelectric effect. Thus, the multi-layer piezoelectric element is capable of functioning as, for example, an automotive fuel injection valve for the injection of fuel into an engine.

Figure 7:
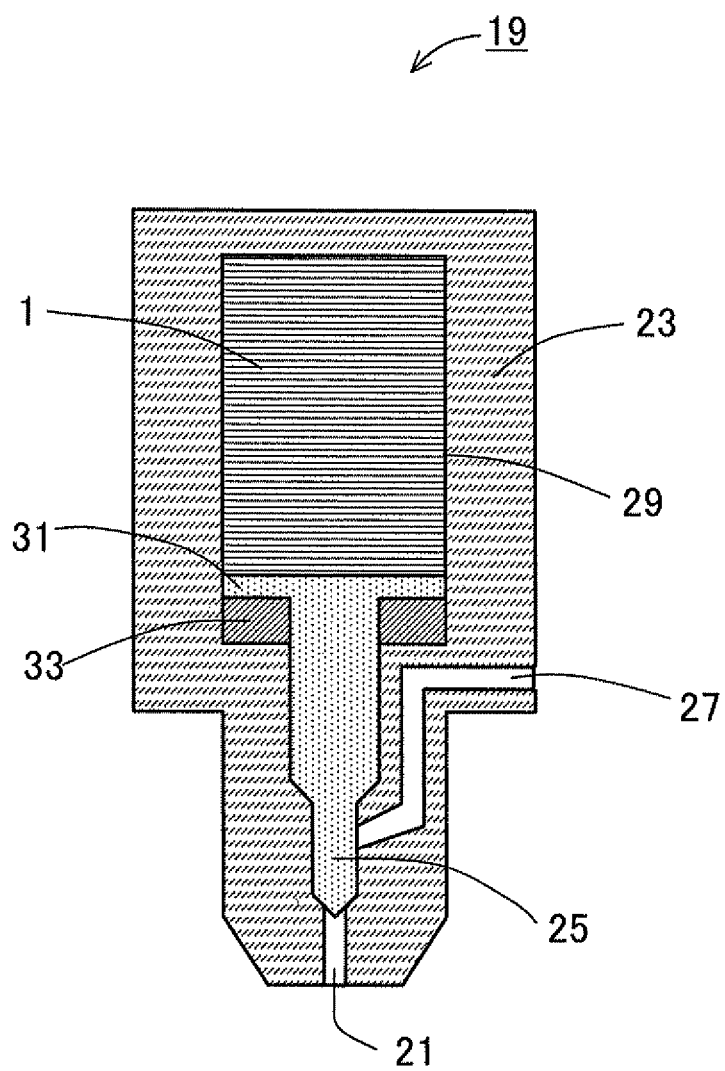
FIG. 7 is a schematic sectional view showing an embodiment of an injection device according to the invention.

Next, an embodiment of an injection device according to the invention will be described. FIG. 7 is a schematic sectional view showing an embodiment of the injection device according to the invention.

As shown in FIG. 7, the injection device 19 according to this embodiment comprises a housing (container) 23 comprising an injection hole 21 at one end thereof, and the foregoing multi-layer piezoelectric element 1 according to the embodiment placed within the housing 23.

In an interior of the housing 23 is disposed a needle valve 25 capable of opening and closing of the injection hole 21. A fluid passage 27 is so disposed as to be capable of communicating with the injection hole 21 in accordance with the movement of the needle valve 25. The fluid passage 27 is coupled to an external fluid supply source, so that a fluid is supplied to the fluid passage 27 under high pressure at all times. Therefore, when the needle valve 25 is operated to open the injection hole 21, then a fluid which has been fed through the fluid passage 27 is injected, through the injection hole 21, to an exterior of the device or into an adjacent container, for example, a fuel chamber of an internal-combustion engine (not shown).

Moreover, an upper end of the needle valve 25 is a piston 31 being formed to have an internal diameter large enough for sliding in a cylinder 29 that is formed in the housing 23. In addition, the foregoing multi-layer piezoelectric element 1 according to the embodiment is placed within the housing 23.

In the injection device 19 thereby constructed, upon extension of the multi-layer piezoelectric element 1 entailed by application of voltage, the piston 31 is pushed forward, thus causing the needle valve 25 to close the fluid passage 27 communicating with the injection hole 21 with a consequent halt on supply of fluid. Moreover, upon stopping the application of voltage, the multi-layer piezoelectric element 1 is contracted, and a disc spring 33 pushes the piston 31 backward, thereby opening the fluid passage 27. In consequence, the injection hole 21 communicates with the fluid passage 27 so that injection of fluid can be carried out through the injection hole 21.

It is noted that the injection device may be so designed that the fluid passage 27 is opened by applying a voltage to the multi-layer piezoelectric element 1, and is contrariwise closed upon a halt on the application of voltage.

Moreover, the injection device 19 according to the embodiment may comprise a housing 23 comprising an injection hole and the multi-layer piezoelectric element 1 according to the embodiment, wherein a fluid stored in the housing is configured to be injected through the injection hole 21 by driving of the multi-layer piezoelectric element 1. That is, the multi-layer piezoelectric element 1 does not necessarily have to be placed within the housing 23. It is essential only that a pressure for control of fluid injection is applied to the interior of the housing by driving of the multi-layer piezoelectric element 1. In this embodiment, the term "fluid" is construed as encompassing not only fuel and ink, but also various liquid fluid such as a conductive paste, and gases. The use of the injection device 19 according to the embodiment makes it possible to control a flow rate of fluid and timing of fluid injection with stability for a long period of time.

When the injection device 19 according to the embodiment using the multi-layer piezoelectric element 1 according to the embodiment is used for an internal-combustion engine, fuel can be injected toward a combustion chamber of the internal-combustion engine such as an engine with higher accuracy for a longer period of time compared to the case of using a conventional injection device.

Figure 8:
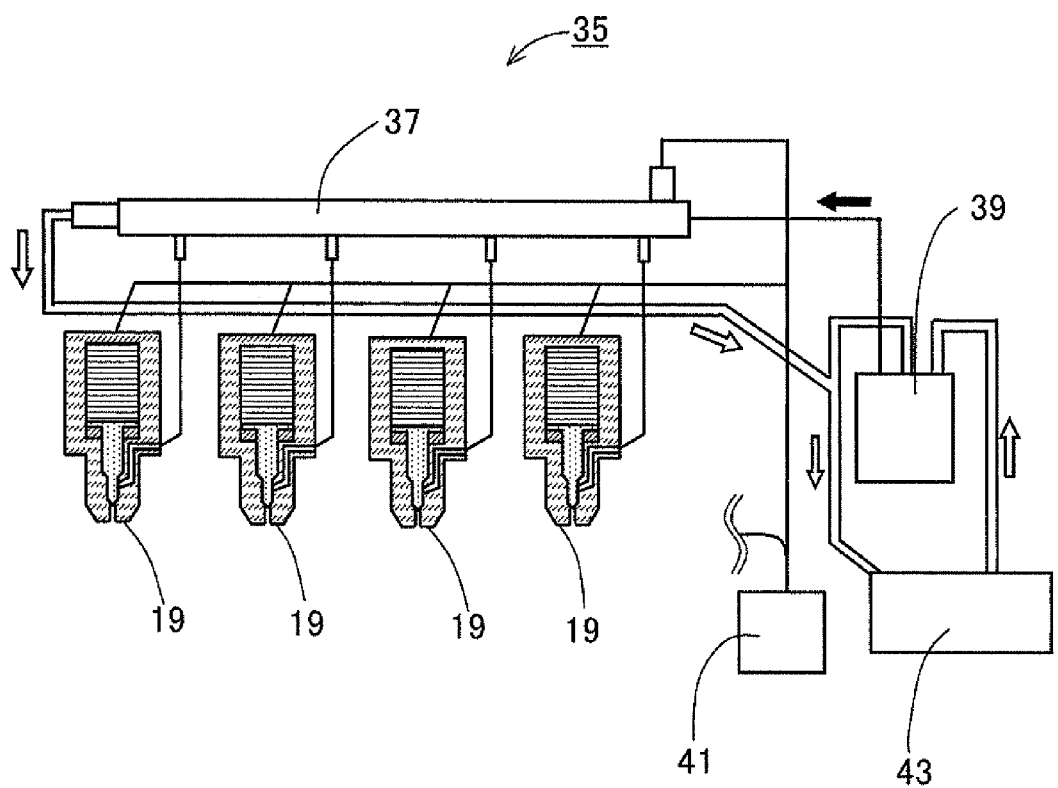
FIG. 8 is a schematic block diagram showing an embodiment of a fuel injection system according to the invention.

Next, an embodiment of a fuel injection system according to the invention will be described. FIG. 8 is a schematic diagram showing an embodiment of the fuel injection system according to the invention.

As shown in FIG. 8, the fuel injection system 35 according to the embodiment comprises a common rail 37 configured to store high-pressure fuel as high-pressure fluid, a plurality of the injection devices 19 according to the embodiment which are configured to inject the high-pressure fluid stored in the common rail 37, a pressure pump 39 configured to supply the high-pressure fluid to the common rail 37, and an injection control unit 41 configured to send a driving signal to the injection devices 19.

The injection control unit 41 controls an amount of injection of the high-pressure fluid and timing of fluid injection on the basis of external information or external signals. For example, in the case of using the injection control unit 41 for injection of fuel into an engine, it is possible to control the amount of fuel injection and the timing of fuel injection while detecting the condition of the interior of the combustion chamber of the engine. The pressure pump 39 plays a role of supplying liquid fuel from a fuel tank 43 to the common rail 37 under high pressure. For example, in the fuel injection system 35 for use in engine application, liquid fuel is fed to the common rail 37 under high pressure of about 1000 to 2000 atmospheres (about 101 MPa to about 203 MPa), and preferably high pressure of about 1500 to 1700 atmospheres (about 152 MPa to about 172 MPa). The common rail 37 stores therein the high-pressure fuel from the pressure pump 39 and acts to feed it to the injection device 19 on an as needed basis. As has already been described, the injection device 19 injects fluid in a certain amount to the exterior of the device or into an adjacent container through the injection hole 21. For example, in the case where an engine is a target of fuel supply by injection, high-pressure fuel in fine-spray form is injected into the combustion chamber of the engine through the injection hole 21.

It is to be understood that the application of the invention is not limited to the specific embodiments described heretofore, and that various changes and modifications can be made without departing from the gist of the invention. For example, while, in the foregoing embodiments, a single external electrode 8 is formed on each of the opposite side surfaces of the stacked body 7, it is possible to form two external electrodes 8 on adjacent side surfaces, respectively, or on the same side surface. Moreover, while, in the foregoing embodiments, the stacked body 7 has a rectangular sectional profile as viewed in a direction perpendicular to the stacked direction, the sectional profile may be defined by a polygon such as a hexagon or octagon, a circle, or a combination of a straight line and an arc, instead.

For example, the multi-layer piezoelectric element 1 of the present embodiment is used for a piezoelectric driving element (piezoelectric actuator), a pressure sensor element, a piezoelectric circuit element, and so forth. Examples of the driving element include a fuel injection device for an automotive engine, a liquid injection device such as an ink-jet system, a precise positioning device such as an optical device, and an anti-vibration device. Examples of the sensor element include a combustion pressure sensor, a knocking sensor, an acceleration sensor, a load sensor, an ultrasound sensor, a pressure-sensing element, and a yaw-rate sensor. Examples of the circuit element include a piezoelectric gyroscope, a piezoelectric switch, a piezoelectric transformer, and a piezoelectric breaker.

EXAMPLES

Example 1

Hereinafter, examples of the multi-layer piezoelectric element pursuant to the invention will be described.

A piezoelectric actuator comprising the multi-layer piezoelectric element of the invention was fabricated in the following manner. Firstly, a ceramic slurry was prepared by mixing calcined powder of piezoelectric ceramic composed predominantly of lead zirconate titanate (PZT: $PbZrO_3$—$PbTiO_3$) having an average particle size of 0.4 μm, a binder, and a plasticizer. The ceramic slurry was shaped into 100 μm-thick ceramic green sheets which turned to piezoelectric layers 3 by the doctor blade method. Moreover, an electrically conductive paste which turned to internal electrode layers was prepared by adding a binder to a silver-palladium alloy.

Next, the electrically conductive paste which turned to the internal electrode layer was printed on one side of the ceramic green sheet by means of screen printing, and 300 ceramic green sheets bearing the printed electrically conductive paste were laminated on top of each other. The resultant was fired at a temperature of 980 to 1100° C., whereupon a stacked body was formed. The stacked body thereby obtained was ground into a predetermined shape by a surface grinder.

Next, a silver/glass-containing electrically conductive paste for forming a stacked body-side layer region (electrically conductive paste A) and a silver/glass-containing electrically conductive paste for forming an exterior-side layer region (electrically conductive paste B) were formed. The electrically conductive paste A for forming the stacked body-side layer region was prepared by adding a binder, a plasticizer, and a solvent to a particle mixture composed of silver particles having an average particle size of 1 μm blended with lead borosilicate glass particles containing Pb and Si, the average particle size of which is 5 μm, in an amount of 10% by mass relative to the sum total of the silver particles and the lead borosilicate glass particles. On the other hand, the silver/glass-containing electrically conductive paste for forming an exterior-side layer region (electrically conductive paste B) was prepared by adding a binder, a plasticizer, and a solvent to a particle mixture composed of silver particles having an average particle size of 1 μm blended with lead borate glass particles containing Pb, the average particle size of which was 5 μm, in an amount of 2% by mass relative to the sum total of the silver particles and the lead borate glass particles.

Next, the electrically conductive paste A was printed on a specific part of a side surface of the stacked body where it was desired to form an external electrode by means of screen printing, and baking treatment was performed thereon at a temperature of 700° C. to form the stacked body-Side layer region. Subsequently the electrically conductive paste B was printed on the surface of the stacked body-side layer region by means of screen printing, and baking treatment was performed thereon at a temperature of 600° C. to form the exterior-side layer region. In this way, the external electrode was formed. In the vicinity of the bonding interface of the thereby formed external electrode and the stacked body, a glass-rich layer having a thickness of about 2 μm was formed. On the side of the external electrode toward the stacked body, the stacked body-side layer region having a glass content of 10% by mass and a thickness of 10 μm was formed. On the exterior side of the external electrode the exterior-side layer region having a glass content of 2% by mass and a thickness of 5 μm was formed. Moreover, the outermost surface of the exterior-side layer region was observed and analyzed by means of a scanning electron microscope and a wavelength-dispersive x-ray micro analyzer, and, as the result, it was found that the glass was distributed along the grain boundary of the silver particles.

Next, an external lead member was fixedly connected to the surface of the exterior-side layer region of the external electrode via solder. The solder for use was silver-blended tin-lead alloy solder having a working temperature (melting point) of 300° C.

Next, the stacked body was immersed in a resin solution containing silicone resin so that a coating of silicone resin could be applied to the side surface of the stacked body including the surface of the external electrode.

In the manner as above described, a multi-layer piezoelectric element was fabricated in the form of the piezoelectric actuator including the external electrode having the stacked body-side layer region containing glass as a secondary constituent at its stacked body-facing side, and the exterior-side layer region containing glass as a minor constituent at its exterior side (Sample number 1).

Moreover, by way of Comparative example 1, there was fabricated a multi-layer piezoelectric element having an external electrode having a thickness of 15 μm by printing a silver/glass-containing electrically conductive paste having a glass content of 10% by mass onto a side surface of a stacked body and then performing baking treatment thereon at a temperature of 700° C. (Sample number 2).

Further, by way of Comparative example 2, there was fabricated a multi-layer piezoelectric element having an external electrode obtained by a method comprising a step of forming a stacked body-side layer region having a thickness of 10 μm by printing a silver/glass-containing electrically conductive paste having a glass content of 10% by mass onto a side surface of a stacked body and then performing baking treatment thereon at a temperature of 700° C., a step of printing a glass-free silver-containing electrically conductive paste onto the surface of the stacked body-side layer region, and a step of performing baking treatment at a temperature of 600° C. (Sample number 3).

As is the case with the multi-layer piezoelectric element of Sample number 1, in the multi-layer piezoelectric elements of Sample numbers 2 and 3, an external lead member was fixedly connected to the external electrode via silver-blended tin-lead alloy solder having a working temperature of 300° C.

Next, in each of the multi-layer piezoelectric elements of Sample numbers 1 to 3, a direct current electric field of 3 kV/mm was applied to the external electrode via the external lead member for 15 minutes to perform polarization treatment. Upon the application of a direct current voltage of 160 V to each of the multi-layer piezoelectric elements, a dis-placement of 40 μm took place in the stacked direction of the stacked body. Moreover, as durability tests, the multi-layer piezoelectric elements were experimentally driven to operate continuously $1 \times 10^8$ times at ambient temperature under the application of alternate current voltage ranging from 0 V to +160 V at a frequency of 150 Hz. The test results are listed in Table 1.

TABLE 1

| Sample number | Provision of stacked body-side layer region in external electrode | Provision of exterior-side layer region in external electrode | Condition after $1 \times 10^8$ cycles of driving operation |
|---|---|---|---|
| 1 | Present | Present | No problem |
| 2 | Present | Absent | External electrode peeled off stacked body that resulted in sparking |
| 3 | Present | Absent | Break occurred in external electrode that resulted in sparking and migration |

As shown in Table 1, in the multi-layer piezoelectric element in accordance with the example of the invention (Sample number 1), even after $1 \times 10^8$ cycles of continuous driving operation, the external electrode showed no sign of abnormality. The reasons therefor are listed in the following:
1) the glass layer region which is rich in glass, is formed in the vicinity of the interface of the external electrode and the stacked body, thereby permitting firm bonding of the external electrode with the stacked body;
2) the exterior-side layer region of the external electrode contains glass as a minor constituent and thus exhibits good solder wettability, wherefore the time required for soldering can be shortened for the protection of the bonding interface of the external electrode and the stacked body against damage resulting from heat liberated by soldering;
3) since glass is distributed on the outermost surface of the exterior-side layer region of the external electrode so as to enter the grain boundary portions of silver particles, when the external electrode is subjected to an excessive tensile stress, a fracture occurs in portions of the glass distributed along the grain boundary for stress reduction, wherefore the external electrode as a whole can be protected from a break; and
4) since glass is distributed on the outermost surface of the exterior-side layer region of the external electrode so as to enter the grain boundary portions of silver particles, the silver particles can be restrained from migration at the surface of the external electrode.

In the multi-layer piezoelectric element in accordance with Comparative example 1 (Sample number 2), since the external electrode has a glass content of 10% by mass, it follows that the surface of the external electrode exhibits poor solder wettability. This necessitated much time for soldering and consequently the bonding interface of the external electrode and the stacked body suffered from damage resulting from heat liberated by soldering. As a result, the external electrode peeled off the side surface of the stacked body in the course of continuous driving operation to test the endurance of the multi-layer piezoelectric element, and a spark was caused at the part of connection between the external electrode and the internal electrode layer.

In the multi-layer piezoelectric element in accordance with Comparative example 2 (Sample number 3), no glass is contained in the exterior side of the external electrode. Therefore, in the course of continuous driving operation of the multi-layer piezoelectric element at high speed under application of high voltage, the external electrode gave way under the tensile stress resulting from the extension of the stacked body and consequently suffered from a break, which caused sparking.

Furthermore, it has been observed that some silver particles migrated between the surface of the positive-pole external electrode and that part of the negative-pole (i.e., ground-pole) internal electrode layer which is exposed at the side surface of the stacked body.

Example 2

Next, there were fabricated multi-layer piezoelectric elements that had substantially the same structure as Sample number 1, except for changing the amount of glass contained in each of the electrically conductive paste A and the electrically conductive paste B (Sample numbers 4 to 11). As was the case with the multi-layer piezoelectric elements of Sample numbers 1 to 3, these multi-layer piezoelectric elements were subjected to polarization, and were experimentally driven to operate continuously $5 \times 10^8$ times at ambient temperature under the application of alternate current voltage ranging from 0 V to +160 V at a frequency of 150 Hz as durability tests. The test results are listed in Table 2.

side surface of the stacked body. In the end, the displacement was reduced to four-fifths the original amount.

In the element of Sample number 8, the amount of glass contained in the exterior-side layer region was unduly small. Therefore, in the course of long-time continuous driving operation, silver migration could not be restrained at the surface of the external electrode, which resulted in sparking between the positive-pole external electrode and the negative-pole (i.e., ground-pole) internal electrode exposed at the side surface of the stacked body.

In the element of Sample number 11, the amount of glass contained in the exterior-side layer region was so large that the solder wettability was deteriorated. This necessitated much time for soldering of the external lead member to the surface of the external electrode, wherefore a load was applied to the bonding interface of the external electrode and the stacked body due to heat liberated by soldering, which resulted in quality degradation of the part of connection. As a result, part of the external electrode peeled off the side surface of the stacked body in the course of long-time continuous driving operation. In the end, the displacement was reduced to two-thirds the original amount.

By way of contrast, in each of the elements of Sample numbers 5, 6, 9, and 10 in which the stacked body-side layer

TABLE 2

| Sample number | Glass content in stacked body-side layer region of external electrode | Glass content in exterior-side layer region of external electrode | Condition after $1 \times 10^8$ cycles of continuous driving operation | Condition after $5 \times 10^8$ cycles of continuous driving operation |
|---|---|---|---|---|
| 1 | 10% by mass | 2% by mass | No problem | No problem |
| 4 | 4% by mass | 2% by mass | No problem | Displacement was reduced to two-thirds the original amount |
| 5 | 5% by mass | 2% by mass | No problem | No problem |
| 6 | 20% by mass | 2% by mass | No problem | No problem |
| 7 | 25% by mass | 2% by mass | No problem | Displacement was reduced to four-fifths the original amount |
| 8 | 10% by mass | 0.005% by mass | No problem | Migration occurred at surface of positive external electrode with consequent sparking between it and exposed portion of negative internal electrode |
| 9 | 10% by mass | 0.01% by mass | No problem | No problem |
| 10 | 10% by mass | 5% by mass | No problem | No problem |
| 11 | 10% by mass | 6% by mass | No problem | Displacement was reduced to two-thirds the original amount |

It will be understood from Table 2 that all the samples showed no sign of abnormality until $1 \times 10^8$ cycles of continuous driving operation were completed. However, following $5 \times 10^8$ cycles of further continuous driving operation, some samples suffered from problems as shown in Table 2.

That is, in the element of Sample number 4, the amount of glass contained in the stacked body-side layer region was so small that part of the external electrode peeled off the side surface of the stacked body. This caused an interruption of the supply of voltage to part of the piezoelectric layers and eventually the displacement was reduced to two-thirds the original amount.

In the element of Sample number 7, the amount of glass contained in the stacked body-side layer region was so large that the resistance of the external electrode was increased. As a result, the external electrode suffered from local heat due to continuous driving operation, and part thereof peeled off the region had a glass content in a range of 5% to 20% by mass and the exterior-side layer region had a glass content in a range of 0.01% to 5% by mass, even when the element was driven to 'operate continuously for long hours under application of a high electric field, neither peeling of the external electrode off the side surface of the stacked body nor silver migration at the surface of the external electrode took place. It thus has been seen that these elements succeed in providing high reliability.

REFERENCE SIGNS LIST

1: Multi-layer piezoelectric element
3: Piezoelectric layer
5: Internal electrode layer
7: Stacked body
8: External electrode 8a: Stacked body-side layer region
8b: Exterior-side layer region
81a: Exposed portion of stacked body-side layer region
81b: Exposed portion of exterior-side layer region
82a: Contact surface of stacked body-side layer region
9: External lead member
10: Solder
11: Electrically conductive particle
12: Glass
19: Injection device
21: Injection hole
23: Housing (Container)
25: Needle valve
27: Fluid passage
29: Cylinder
31: Piston
33: Disc spring
35: Fuel injection system
37: Common rail
39: Pressure pump
41: Injection control unit
43: Fuel tank

The invention claimed is:

1. A multi-layer piezoelectric element, comprising:
a stacked body configured so that piezoelectric layers and internal electrode layers are alternately laminated; and
an external electrode composed of a sintered material of both electrically conductive particles and a glass, the external electrode which is bonded to a side surface of the stacked body and makes electrical connection with the internal electrode layers, wherein
the external electrode comprises a stacked body-side layer region with a thickness in a range 1 μm to 20 μm, which is located closer to the stacked body and contains glass in an amount of 5% to 20% by mass, and an exterior-side layer region with a thickness in a range of 0.1 μm to 15 μm, which is located closer to an exterior and contains glass in an amount of 0.01% to 5% by mass,
the glass of the exterior-side layer region is distributed along a grain boundary of the electrically conductive particles on an outermost surface of the exterior-side layer region, and
a ratio in area of the glass to an outermost surface of the exterior-side layer region falls within a range of 0.1% to 10%.

2. The multi-layer piezoelectric element according to claim 1, wherein each of the glass in the stacked body-side layer region and the glass in the exterior-side layer region contains Pb.

3. The multi-layer piezoelectric element according to claim 2, wherein the glass in the stacked body-side layer region further contains Si.

4. The multi-layer piezoelectric element according to claim 1, wherein the stacked body-side layer region comprises a glass layer region which is rich in the glass thereof in a vicinity of an interface of the stacked body-side layer region and the stacked body.

5. The multi-layer piezoelectric element according to claim 1, wherein the stacked body-side layer region and the exterior-side layer region contact with each other, and the glass is distributed along the grain boundary of the electrically conductive particles on an exposed portion of the exterior-side layer region including the outermost surface thereof.

6. The multi-layer piezoelectric element according to claim 5, wherein the glass in an exposed portion of the stacked body-side layer region is distributed so as to cover the electrically conductive particles.

7. The multi-layer piezoelectric element according to claim 5, wherein the glass is distributed along the grain boundary of the electrically conductive particles on a contact surface of the stacked body-side layer region abutted with the exterior-side layer region.

8. An injection device, comprising:
a container comprising an injection hole; and
the multi-layer piezoelectric element according to claim 1, wherein
a fluid stored in the container is configured to be injected through the injection hole by driving the multi-layer piezoelectric element.

9. A fuel injection system, comprising:
a common rail configured to store high-pressure fuel;
the injection device according to claim 8, which is configured to inject the high-pressure fuel stored in the common rail;
a pressure pump configured to supply the high-pressure fuel to the common rail; and
an injection control unit configured to send a driving signal to the injection device.

* * * * *